United States Patent
Tsorng et al.

(10) Patent No.: US 12,369,268 B2
(45) Date of Patent: Jul. 22, 2025

(54) ADJUSTABLE CABLE CLIP

(71) Applicant: Quanta Computer Inc., Taoyuan (TW)

(72) Inventors: Yaw-Tzorng Tsorng, Taoyuan (TW);
Ming-Lung Wang, Taoyuan (TW);
Pei-Jung Hsieh, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/470,122

(22) Filed: Sep. 19, 2023

(65) Prior Publication Data
US 2025/0098100 A1 Mar. 20, 2025

(51) Int. Cl.
*H05K 7/14* (2006.01)

(52) U.S. Cl.
CPC .................. *H05K 7/1491* (2013.01)

(58) Field of Classification Search
CPC .................................... H05K 7/1491
USPC ........................ 24/16 PB; 248/68.1
See application file for complete search history.

(56) References Cited

U.S. PATENT DOCUMENTS

| | | | | |
|---|---|---|---|---|
| 508,822 A * | 11/1893 | Evory | ................... | F16L 3/2235 248/74.1 |
| 2,394,518 A * | 2/1946 | Kindorf | .................. | F16L 3/227 248/68.1 |
| 2,505,044 A * | 4/1950 | Heinrich | .................. | A44C 5/14 224/176 |
| 3,050,578 A * | 8/1962 | Huebner | ................ | F16L 3/2235 24/17 AP |
| 3,054,585 A * | 9/1962 | Roberts | .................... | F16L 3/233 D8/383 |
| 3,088,702 A * | 5/1963 | Orenick | .................. | F16L 3/233 24/339 |
| 3,169,004 A * | 2/1965 | Rapata | ....................... | F16B 2/08 248/74.5 |
| D214,736 S * | 7/1969 | Anderson | ..................... | D30/152 |
| 4,234,999 A * | 11/1980 | Winter | ...................... | F16B 2/10 248/74.3 |
| 4,274,612 A * | 6/1981 | Massey | .............. | B65D 63/1027 24/17 AP |
| 4,371,137 A * | 2/1983 | Anscher | ..................... | F16L 3/23 248/74.3 |
| 4,592,734 A * | 6/1986 | Metiver | .................. | B63B 32/45 441/74 |
| D322,871 S * | 12/1991 | Heyman | ..................... | D30/152 |

(Continued)

FOREIGN PATENT DOCUMENTS

CN 207966139 U * 10/2018

*Primary Examiner* — Kimberly T Wood
(74) *Attorney, Agent, or Firm* — NIXON PEABODY LLP (57) ABSTRACT

An adjustable cable clip is disclosed. The cable clip includes a base, a first strap, and a second strap. The first strap is coupled to the base. The first strap has a first interior surface, a first exterior surface opposing the first interior surface, and an aperture. The second strap is coupled to the base opposite from the first strap. The second strap has a second interior surface, a second exterior surface opposing the second interior surface, and a projection. The first strap and the second strap are configured to couple together to form a cable area by the projection coupling with the aperture such that the first interior surface touches the second exterior surface or the first exterior surface touches the second interior surface.

16 Claims, 6 Drawing Sheets

(56) References Cited

U.S. PATENT DOCUMENTS

| | | | | |
|---|---|---|---|---|
| 6,581,885 B2 * | 6/2003 | Polad | ................... | F16L 3/137 |
| | | | | 248/205.3 |
| 6,636,679 B1 * | 10/2003 | Mereness | ............ | G02B 6/4471 |
| | | | | 385/136 |
| D580,748 S * | 11/2008 | Polak | ............................ | D8/394 |
| 8,088,043 B2 * | 1/2012 | Andren | ................. | A63B 69/00 |
| | | | | 482/8 |
| 8,313,128 B2 * | 11/2012 | Belyea | .................... | E05B 13/00 |
| | | | | 292/288 |
| 9,482,113 B2 * | 11/2016 | Graily | ...................... | F02C 7/25 |
| 9,926,953 B2 * | 3/2018 | Russell-Clarke | .. | A44B 13/0029 |
| 11,259,606 B2 * | 3/2022 | Dencek | ................. | A61C 19/00 |
| 2003/0011172 A1 * | 1/2003 | Compton | ............... | A63C 11/00 |
| | | | | 280/626 |
| 2004/0108420 A1 * | 6/2004 | Snyder | ..................... | F16L 3/04 |
| | | | | 248/68.1 |
| 2010/0243826 A1 * | 9/2010 | West | ..................... | F16L 55/035 |
| | | | | 248/68.1 |
| 2014/0027584 A1 * | 1/2014 | Pauchet | ................ | F16L 3/123 |
| | | | | 248/68.1 |
| 2016/0128209 A1 * | 5/2016 | Yoon | ....................... | G06F 1/163 |
| | | | | 361/679.01 |
| 2021/0307460 A1 * | 10/2021 | Amano | ............... | A44C 5/2071 |
| 2023/0329469 A1 * | 10/2023 | Alvarez Garcia | ..... | A47G 29/22 |

\* cited by examiner

ADJUSTABLE CABLE CLIP

FIELD OF THE INVENTION

The present invention relates generally to a structure for securing cables and, more specifically, to an adjustable cable clip for securing cables within a computing system.

BACKGROUND OF THE INVENTION

Computing systems, and particularly server computing systems, can include many cables. Conventional cable clips are used to organize the cables and arrange the routing of the cables, such as within the chassis of the computing system. However, conventional cable clips do not have a closed structure, perhaps due to the length, thickness, and/or number of cables. Cables often are not securely fixed within conventional cable clips, which may cause the cable clip to break or cause the cables to fall out. In addition, when the number of cables is low, such as only one or two cables, the remaining space cannot be saved because there is no structure to adjust the size of the cable clip. Even further, in the case of no cable routing for a specific conventional cable clip, conventional cable clips cannot be flattened. Thus, the space (e.g., height space) occupied by the conventional cable clip may cause difficulties when disassembling or assembling the computing system.

The present disclosure is directed to solving the above-referenced problems by providing an adjustable cable clip.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a cable clip for routing one or more cables of a computing system is disclosed. The cable clip includes a base, and first strap, and a second strap. The first strap is coupled to the base at a first base end. The first strap has a first interior surface, a first exterior surface opposing the first interior surface, and an aperture. The first strap further has a first connecting end that flexibly buckles in a coupled position. The second strap is coupled to the base at a second base end that is opposite from the first base end. The second strap has a second interior surface, a second exterior surface opposing the second interior surface, and a projection. The second strap further has a second connecting end that flexibly buckles in the coupled position. The first strap and the second strap are configured to couple together in the coupled position, and the first connecting end and the second connecting end buckle in an overlapping manner with each other in the coupled position. The buckling forms a cable area when the projection is coupled with the aperture such that the first interior surface touches the second exterior surface or the first exterior surface touches the second interior surface. The cable area is an interior space for receiving one or more of the routing cables of the computing system.

According to one aspect of the above embodiment, the aperture of the first strap includes a plurality of apertures. The projection is configured to selectively couple with the plurality of apertures to adjust the cable area. According to another aspect of the above embodiment, the projection of the second strap includes a plurality of projections. The plurality of projections is configured to selectively couple with the plurality of apertures to adjust the cable area.

According to another aspect of the above embodiment, the projection extends from the second interior surface of the second strap. According to an aspect of this embodiment, the first exterior surface of the first strap is in direct contact with the second interior surface of the second strap when the first strap is coupled to the second strap.

According to another aspect of the above embodiment, the base includes a first rung at the first base end and a second rung at the second base end. A proximal end of the first strap wraps around the first rung to couple the first strap to the first base end, and a proximal end of the second strap wraps around the second rung to couple the second strap to the second base end. According to an aspect of this embodiment, the first strap is configured to rotate around the first rung and the second strap is configured to rotate around the second rung so that the first strap and the second strap lie flat when not coupled together. According to an aspect of this embodiment, the proximal end of the first strap includes a first metal sheet, and the proximal end of the second strap includes a second metal sheet. According to an aspect of this embodiment, the first strap is made of rubber and/or plastic and the first metal sheet is embedded therein, and the second strap is made of rubber and/or plastic and the second metal sheet is embedded therein.

According to another aspect of the above embodiment, the projection includes a shaft and a head connected to a proximal end of the shaft. According to an aspect of this embodiment, the head is tapered to guide the head through the aperture. According to an aspect of this embodiment, the head is larger in diameter than the shaft to form a lip around the proximal end of the shaft. According to an aspect of this embodiment, the lip forms a snap fit with the aperture.

According to another aspect of the above embodiment, the first strap is longer than the second strap.

According to another aspect of the above embodiment, the base is configured to mount to a computing system. According to an aspect of this embodiment, the base is configured to mount to a chassis or a board of the computing system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

The present disclosure is directed to an adjustable cable clip that can clasp to define variable cable areas to secure different amounts (e.g., numbers, sizes, etc.) of cables. The adjustable cable clip of the present disclosure can also lie flat to free up additional space (e.g., height) in the computing system when not in use securing cables. The adjustable cable clip includes two adjustable straps. The arrangement of how the straps secure together can be adjusted to better accommodate cables as compared to conventional cable clips.

Figure 1:
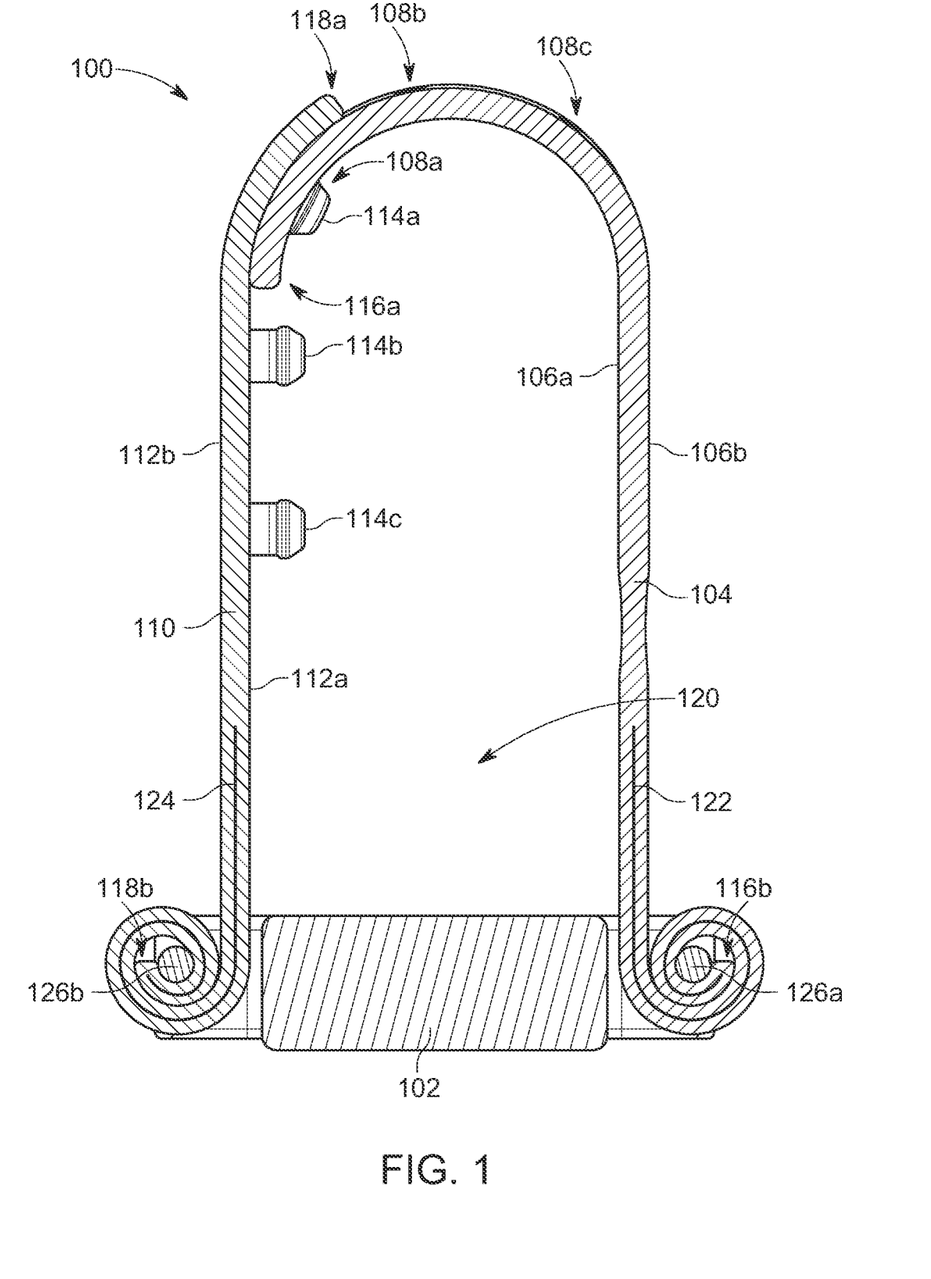
FIG. 1 shows a cross-sectional view of a cable clip, according to an aspect of the present disclosure.
Figure 2:
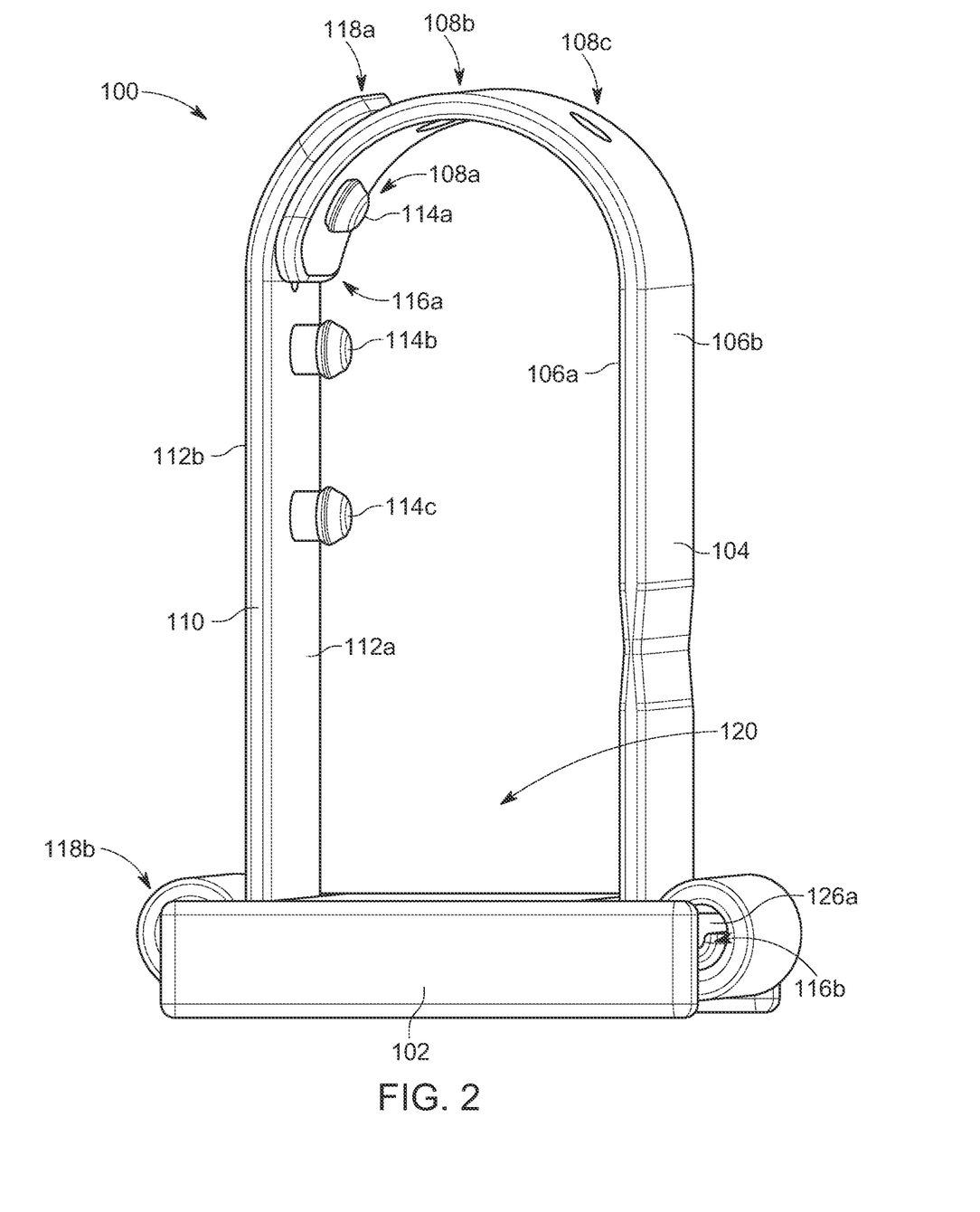
FIG. 2 shows a side perspective view of a cable clip, according to an aspect of the present disclosure.
Figure 8:
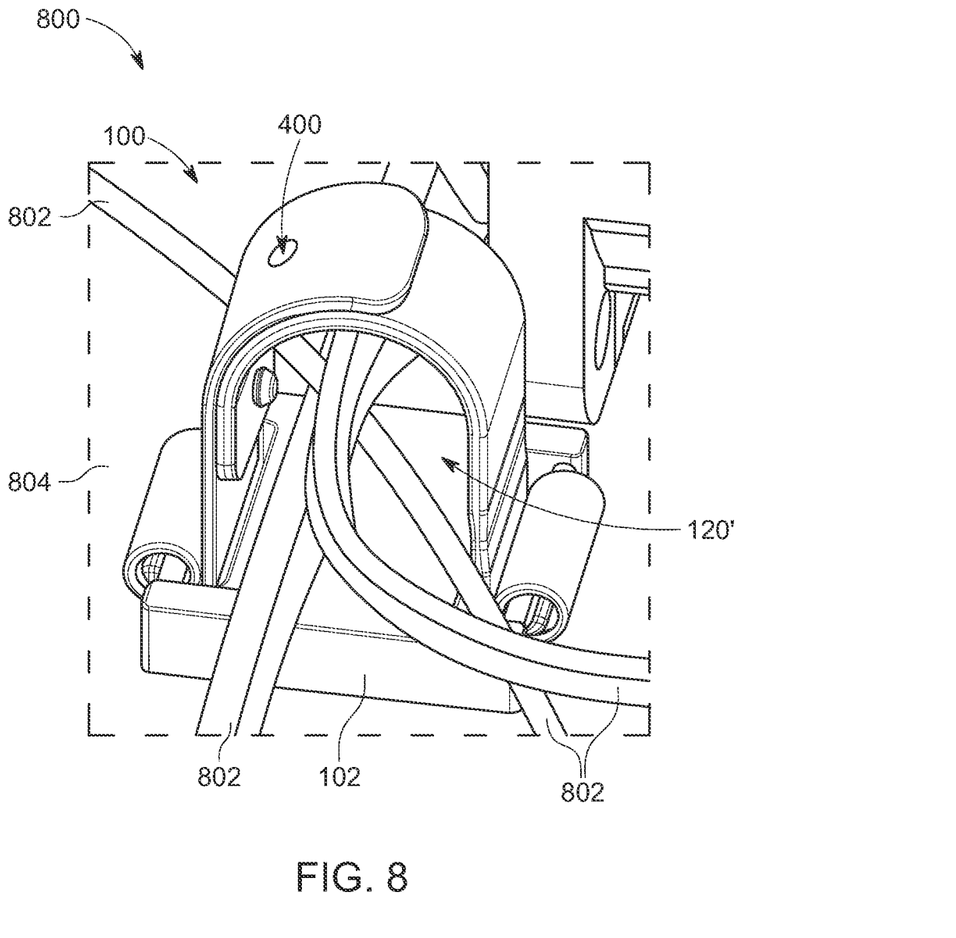
FIG. 8 shows a perspective view of a cable clip securing cables within a computing system, according to an aspect of the present disclosure.

Referring to FIGS. 1 and 2, shown are a cross-sectional view and a side perspective view, respectively, of a cable clip 100, according to an aspect of the present disclosure. The cable clip 100 includes a base 102. The base 102 can be configured to mount to a computing system (FIG. 8). For example, the base 102 can be configured to mount to a chassis or a board (FIG. 8) of the computing system. The base 102 can be mounted by an adhesive or mechanical fastener (e.g., screw) to the computing system.

The cable clip 100 further includes a strap 104 coupled to the base 102. The strap 104 has an interior surface 106a, an exterior surface 106b opposing the interior surface 106a, and apertures 108a-108c (together referred to as apertures 108). Although three apertures 108a-108c are shown, the number of apertures can vary, such as one aperture, two apertures, four apertures, or more than four apertures.

The cable clip 100 further includes a strap 110 coupled to the base 102 opposite from the strap 104. The strap 110 similarly has an interior surface 112a, an exterior surface 112b opposing the interior surface 112a, and projections 114a-114c (together referred to as projections 114). Although three projections 114a-114c are shown, the number of projections can vary, such as one projection, two projections, four projections, or more than four projections.

The number of projections 114 can match the number of apertures 108. Alternatively, there can be fewer or more projections 114 than apertures 108. For example, there may be many apertures 108 and only one projection 114.

As shown in FIGS. 1 and 2, the projections 114 can extend from the interior surface 112a of the strap 110. Alternatively, the projections 114 can extend from the exterior surface 112b of the strap 110.

According to some implementations, each projection 114 is configured to selectively couple with each aperture 108. Alternatively, certain projections 114 can be configured to couple with to only certain apertures 108.

As further disclosed below, which projection 114 couples with which aperture 108 controls the size of a cable area 120 defined by the cable clip 100. The cable area 120 defines the interior area or space that receives one or more cables, as further disclosed with respect to FIG. 8. In FIGS. 1 and 2, the distal projection 114a on the strap 110 is coupled to the distal aperture 108a on the strap 104, which defines the largest possible cable area 120 of the cable clip 100.

The strap 104 includes a distal end 116a, which is also referred to as connecting end 116a, and a proximal end 116b. Similarly, the strap 110 includes a distal end 118a, which is also referred to as connecting end 118a, and a proximal end 118b. The straps 104 and 110 mate by the distal end 116a of the strap 104 bending counterclockwise towards the distal end 118a of the strap 110 to form a loop. Where the projections 114 are on the interior surface 112a of the strap 110, as shown in FIGS. 1 and 2, the exterior surface 106b of the strap 104 touches in direct contact against the interior surface 112a of the strap 110 when the straps 104 and 110 are coupled. Alternatively, if the projections 114 are on the exterior surface 112b of the strap 110, the interior surface 106a of the strap 104 touches against the exterior surface 112b of the strap 110 when the straps 104 and 110 are coupled. Thus, the distal end 116a and the distal end 118a buckle together in an overlapping manner with each other in the coupled position, forming the cable area.

The straps 104 and 110 can be made of rubber and/or plastic. According to some aspects, the straps 104 and 110 can be resilient along their entire lengths (e.g., from the proximal ends 116b and 118b to the distal ends 116a and 118a, respectively). Alternatively, the straps 104 and 110 may not be resilient. Further, the straps 104 and 110 can be the same length. Alternatively, the strap 104 can be longer or shorter than the strap 110.

Referring to FIG. 1, in some implementations the straps 104 and 110 can include embedded metal sheets 122 and 124, respectively. The metal sheets 122 and 124 can provide resilience that helps that straps 104 and 110 maintain the upright position shown in FIG. 1 when clasped together.

The straps 104 and 110 can couple to the base 102 according to many different configurations. According to some aspects, and as best shown in FIG. 1, the base 102 can include base ends 126a and 126b (together referred to as base ends 126). The base end 126a is opposite from the base end 126b. The proximal ends 116b and 118b of the straps 104 and 110 can wrap around the base ends 126a and 126b, respectively.

Figure 4:
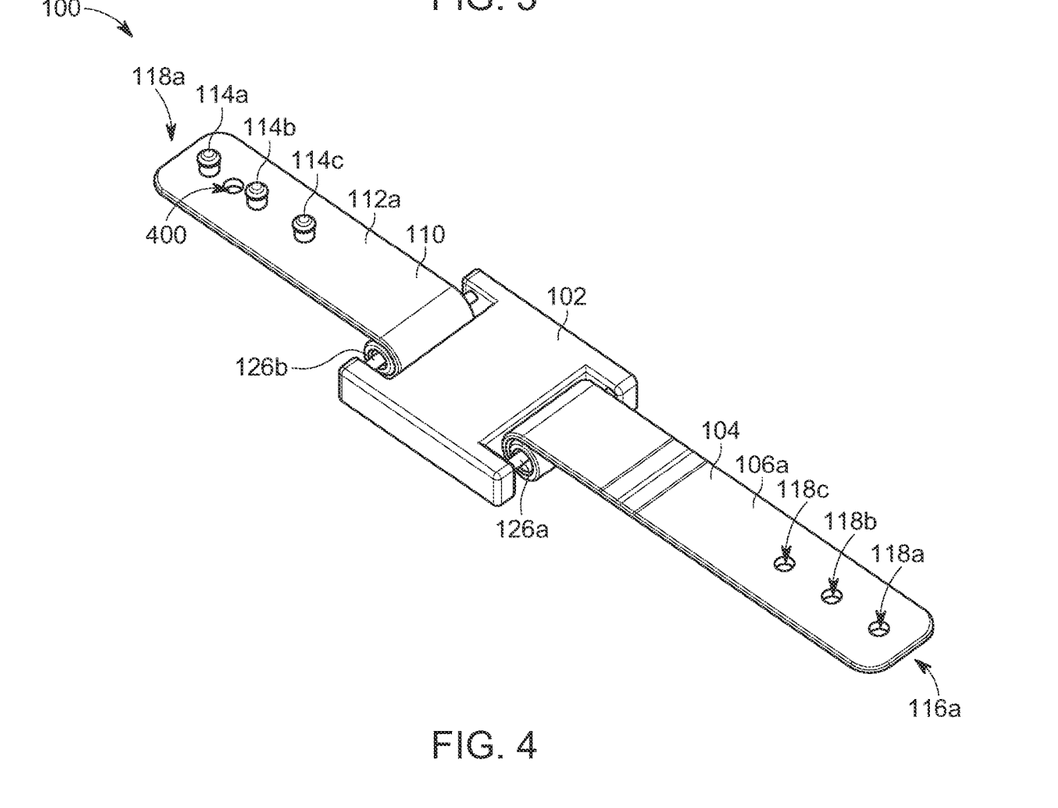
FIG. 4 shows a perspective view of a cable clip in a flat configuration, according to an aspect of the present disclosure.

According to a specific implementation, and as shown in, for example, FIGS. 1 and 4, the base ends 126 can be configured as rungs (also referred to as rungs 126). The proximal ends 116b and 118b of the straps 104 and 110 can wrap around the rungs 126 to secure the straps to the base 102. With the metal sheets 122 and 124 present, the metal sheets 122 and 124 can maintain the straps 104 and 110 wrapped around the rungs 126. The straps 104 and 110 coupled to the rungs 126 of the base 102 as shown and disclosed allows the straps 104 and 110 to rotate about the rungs 126, which allows the straps 104 and 110 to lie flat, as disclosed below with respect to FIG. 4.

Figure 3:
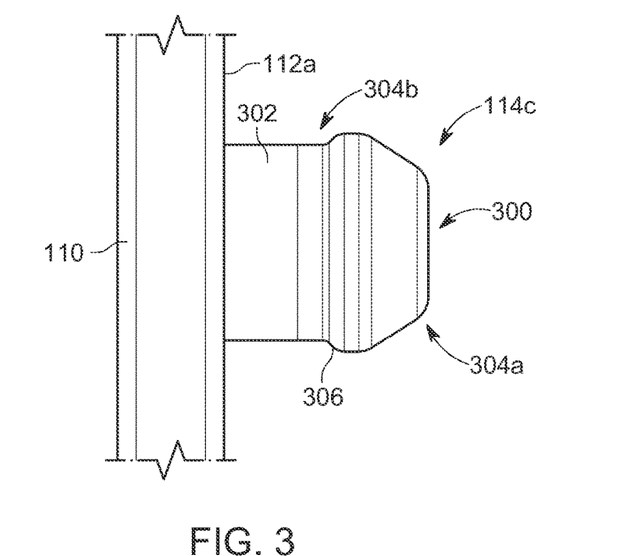
FIG. 3 shows a detailed view of a projection of a cable clip, according to an aspect of the present disclosure.

Referring to FIG. 3, shown is a detailed view of the projection 114c of FIGS. 1 and 2, according to an aspect of the present disclosure. The projection 114c can be representative of all of the projections 114. The projection 114c includes a head 300 that is connected to a shaft 302. The shaft 302 is connected to the interior surface 112a of the strap 110. The profile of the shaft 302 generally matches the profile of the apertures 108 and can be, for example, generally cylindrical or circular. However, other profiles of the shaft 302 and the apertures 108 are possible, such as triangular, square, rectangular, etc.

The profile of the head 300 generally matches the shape of the profile of the shaft 302, such as circular, as shown in FIG. 3. However, the head 300 can be tapered such that the distal end 304a of the head 300 is smaller in diameter than the proximal end 304b of the head 300. Moreover, the distal end 304a of the head 300 can be smaller than the shaft 302. This geometry allows the tapered head 300 to be guided and pass through the apertures 108 for coupling the straps 104 and 110 (FIGS. 1 and 2) together. According to some implementations, the proximal end 304b of the head 300 can be larger than the shaft 302 such that a lip 306 is present where the head 300 touches the shaft 302. The lip 306 can be slightly larger than the apertures 108 to create a snap fit between the projection 114c (or projections 114) and the aperture 108.

FIG. 4 shows a perspective view of the cable clip 100 in a flat configuration, according to an aspect of the present disclosure. The connection between the straps 104 and 110 and the base 102 via the rungs 126 allows the straps 104 to 110 to lie flat when not coupled together. This allows the cable clip 100 to take up less vertical space when not in use, such as when the straps 104 and 110 are not coupled together.

As best shown in FIG. 4, the strap 110 can include an aperture 400. The aperture 400 can couple to a corresponding projection (not shown) in a computing system (FIG. 8) for coupling the strap 110 in the lie-flat position of FIG. 4. A one or more similar projections in the computing system (FIG. 8) can couple to one or more of the apertures 108 to couple the strap 104 in the lie-flat position of FIG. 4.

Figure 5:
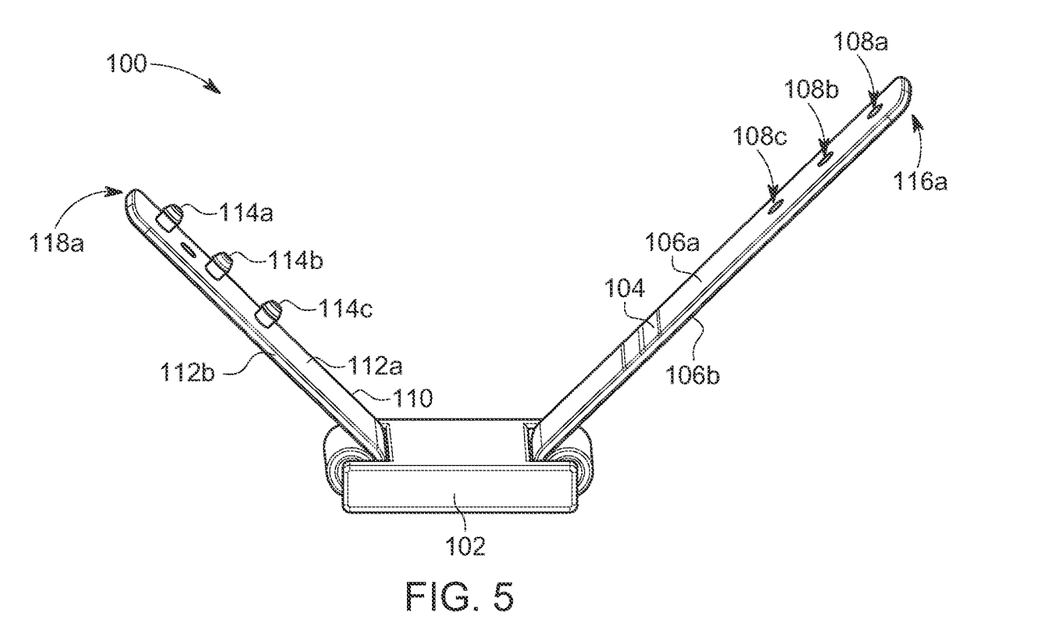
FIG. 5 shows a perspective view of a cable clip in the process of being clasped, according to an aspect of the present disclosure.
Figure 6:
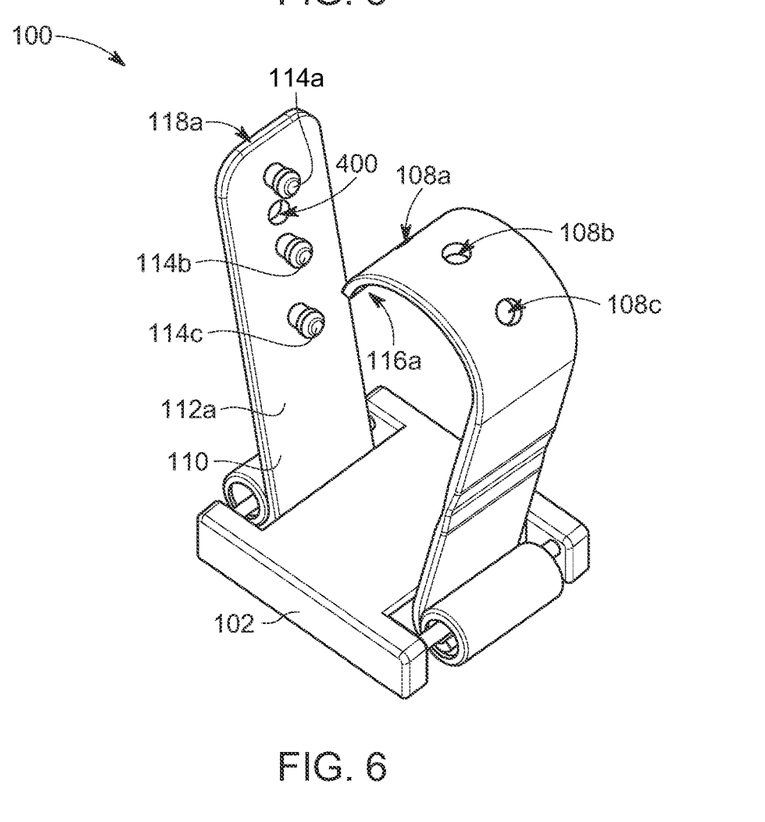
FIG. 6 shows a perspective view of a cable clip further in the process of being clasped, according to an aspect of the present disclosure.
Figure 7:
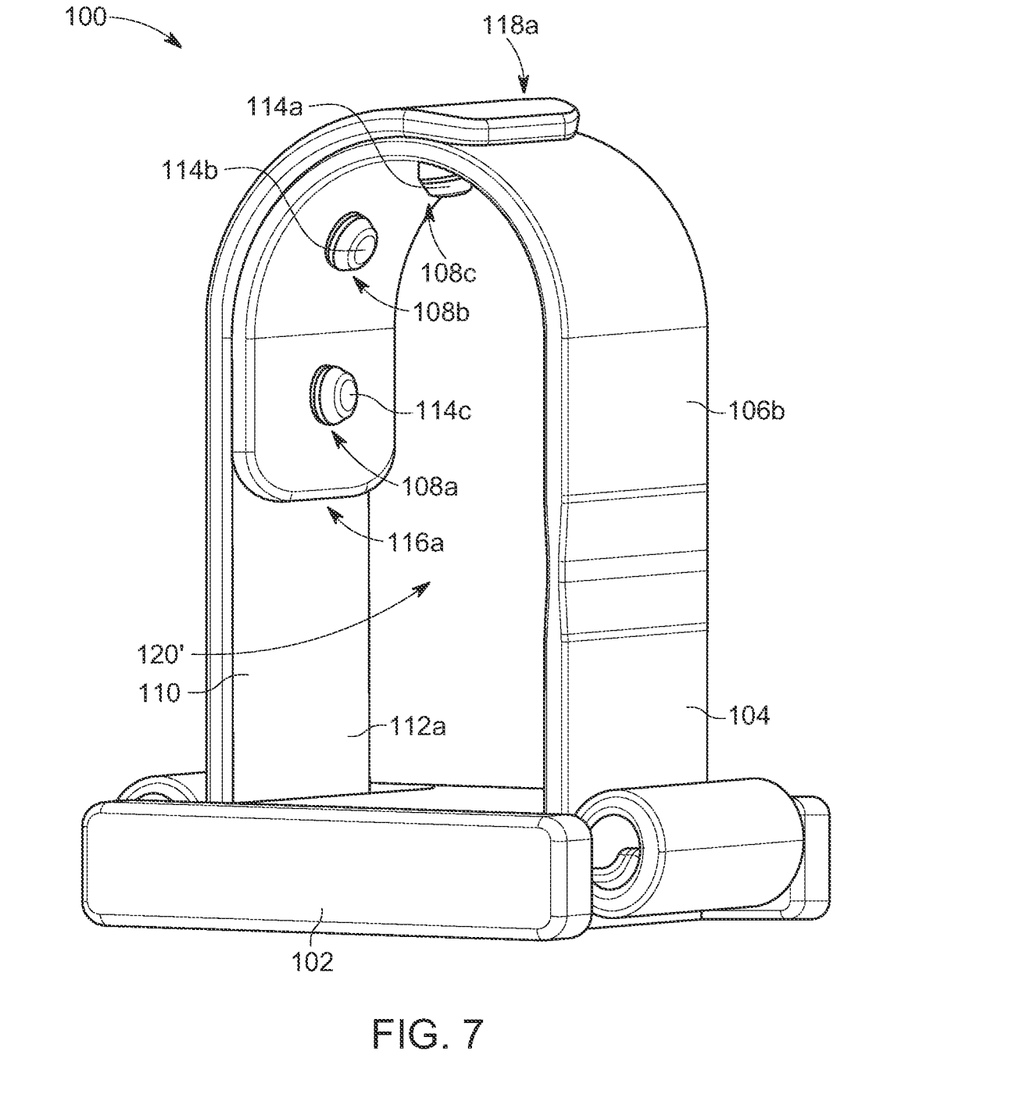
FIG. 7 shows a side perspective view of a clasped cable clip, according to an aspect of the present disclosure.

Referring to FIG. 5, the straps 104 and 110 can be rotated towards each other from the lie-flat position shown in FIG. 4 to clasp the straps 104 and 110 together. Next, and referring to FIG. 6, the distal end 116a of the strap 104 can be bent down counterclockwise in the orientation of FIG. 6 or towards the strap 110. This brings the apertures 108 towards the projections 114 on the interior surface 112a of the strap 110. Next, and referring to FIG. 7, the straps 104 and 110 can be coupled together, as shown. Contrary to FIGS. 1 and 2, FIG. 7 shows each projection 114 being coupled to a respective aperture 108. For example, projection 114c is coupled to aperture 108a, projection 114b is coupled to aperture 108b, and projection 114a is coupled to aperture 108c. This reduces the size of the cable area 120' compared to the size of the cable area 120 shown in FIGS. 1 and 2. This size of the cable area 120' can be further reduced if, for example, the projection 114c is coupled with the aperture 108c. This would leave the projections 114a and 114b not coupled with an aperture 108.

FIG. 8 shows a perspective view of the cable clip 100 securing cables 802 within a computing system 800, according to an aspect of the present disclosure. The base 102 can be coupled to, for example, the chassis 804 of the computing system 800. As shown, the cable clip 100 holds the cables 802 within the cable area 120' for proper routing of the cables 802 within the computing system 800.

This adjustable cable clip of the present disclosure is labor-saving, easy to operate, toolless, modular (e.g., can be used on different products), provides a closed structure, can lie flat, and is adjustable, all of which are not found in conventional cable clips.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cable clip for routing one or more cables of a computing system, the cable clip comprising:
    a base;
    a first strap coupled to the base at a first base end, the first strap having a first interior surface, a first exterior surface opposing the first interior surface, and an aperture, the first strap further having a first connecting end that flexibly buckles in a coupled position; and
    a second strap coupled to the base at a second base end that is opposite from the first base end, the second strap having a second interior surface, a second exterior surface opposing the second interior surface, and a projection, the second strap further having a second connecting end that flexibly buckles in the coupled position;
    wherein the first strap and the second strap are configured to couple together in the coupled position, the first connecting end and the second connecting end buckling in an overlapping manner with each other in the coupled position, the buckling forming a cable area when the projection is coupled with the aperture such that the first interior surface touches the second exterior surface or the first exterior surface touches the second interior surface, the cable area being an interior space for receiving one or more of the routing one or more cables of the computing system,
    wherein the base includes a first rung at the first base end and a second rung at the second base end, and wherein a proximal end of first strap wraps around the first rung to couple the first strap to the first base end and a proximal end of second strap wraps around the second rung to couple the second strap to the second base end, each of the first and second strap wraps including overlapping layers concentrically wrapped, respectively, around the first and second rung, and wherein the projection includes a shaft and a head connected to a proximal end of the shaft.

2. The cable clip of claim 1, wherein the aperture of the first strap includes a plurality of apertures, and the projection is configured to selectively couple with the plurality of apertures to adjust the cable area.

3. The cable clip of claim 2, wherein the projection of the second strap includes a plurality of projections, and the plurality of projections is configured to selectively couple with the plurality of apertures to adjust the cable area.

4. The cable clip of claim 1, wherein the projection extends from the second interior surface of the second strap.

5. The cable clip of claim 4, wherein the first exterior surface of the first strap is in direct contact with the second interior surface of the second strap when the first strap is coupled to the second strap.

6. The cable clip of claim 1, wherein the first strap is configured to rotate around the first rung and the second strap is configured to rotate around the second rung so that the first strap and the second strap lie flat when not coupled together.

7. The cable clip of claim 6, wherein the proximal end of the first strap includes a first metal sheet, and the proximal end of the second strap includes a second metal sheet.

8. The cable clip of claim 7, wherein the first strap is made of rubber and/or plastic and the first metal sheet is embedded therein, and the second strap is made of rubber and/or plastic and the second metal sheet is embedded therein.

9. The cable clip of claim 1, wherein the head is tapered to guide the head through the aperture.

10. The cable clip of claim 1, wherein the head is larger in diameter than the shaft to form a lip around the proximal end of the shaft.

11. The cable clip of claim 9, wherein the lip forms a snap fit with the aperture.

12. The cable clip of claim 1, wherein the first strap is longer than the second strap.

13. The cable clip of claim 1, wherein the base is configured to mount to a computing system.

14. The cable clip of claim 13, wherein the base is configured to mount to a chassis or a board of the computing system.

15. A cable clip system comprising:
    a chassis;
    one or more cables routed along the chassis; and
    a cable clip coupled to the chassis for routing the one or more cables within a cable area, the cable clip including
        a base;
        a first strap coupled to the base at a first base end, the first strap having a first interior surface, a first exterior surface opposing the first interior surface, and an aperture, the first strap further having a first connecting end that flexibly buckles in a coupled position; and
        a second strap coupled to the base at a second base end that is opposite from the first base end, the second strap having a second interior surface, a second exterior surface opposing the second interior surface, and a projection, the second strap further having a second connecting end that flexibly buckles in the coupled position;
        wherein the first strap and the second strap are configured to couple together in the coupled position, the first connecting end and the second connecting end buckling in an overlapping manner with each other in the coupled position, the buckling forming the cable area when the projection is coupled with the aperture such that the first interior surface touches the second exterior surface or the first exterior surface touches the second interior surface, the cable area being an interior space for receiving one or more of the routing one or more cables of the computing system, wherein the base includes a first rung at the first base end and a second rung at the second base end, and wherein a proximal end of first strap wraps around the first rung to couple the first strap to the first base end and a proximal end of second strap wraps around the second rung to couple the second strap to the second base end, and wherein the projection includes a shaft and a head connected to a proximal end of the shaft.

16. A cable clip system comprising:

a chassis; and a cable clip coupled to the chassis for routing one or more cables, the cable clip including a base;

a first strap coupled to the base at a first base end, the first strap having a first interior surface, a first exterior surface opposing the first interior surface, and a plurality of apertures, the first strap further having a first connecting end that flexibly buckles in a coupled position; and a second strap coupled to the base at a second base end that is opposite from the first base end, the second strap having a second interior surface, a second exterior surface opposing the second interior surface, and a plurality of projections configured to selectively couple with the plurality of apertures to adjust a cable area, the second strap further having a second connecting end that flexibly buckles in the coupled position;

wherein the first strap and the second strap are configured to couple together in the coupled position, the first connecting end and the second connecting end buckling in an overlapping manner with each other in the coupled position, the buckling forming the cable area when a projection of the plurality of projections are coupled with a respective apertures of the plurality of apertures such that the first interior surface touches the second exterior surface or the first exterior surface touches the second interior surface, the cable area being an interior space for receiving one or more of the routing one or more cables of the computing system, wherein the base includes a first rung at the first base end and a second rung at the second base end, and wherein a proximal end of first strap wraps around the first rung to couple the first strap to the first base end and a proximal end of second strap wraps around the second rung to couple the second strap to the second base end, and wherein the projection includes a shaft and a head connected to a proximal end of the shaft.

* * * * *